United States Patent [19]

Lau

[11] Patent Number: 4,545,116

[45] Date of Patent: Oct. 8, 1985

[54] METHOD OF FORMING A TITANIUM DISILICIDE

[75] Inventor: Chi K. Lau, Richardson, Tex.

[73] Assignee: Texas Instruments Incorporated, Dallas, Tex.

[21] Appl. No.: 492,069

[22] Filed: May 6, 1983

[51] Int. Cl.[4] .................... H01L 21/285; H01L 29/46
[52] U.S. Cl. ........................................ 29/591; 427/88; 427/91; 427/93; 357/67; 357/71; 148/DIG. 147
[58] Field of Search ................................. 29/589–591; 204/192 C, 192 SP, 192 EL; 427/84, 88, 91, 93; 357/67 S, 71; 148/DIG. 147

[56] References Cited

U.S. PATENT DOCUMENTS 3,855,612 12/1974 Rosvold .............................. 357/15
4,056,642 11/1977 Saxena et al. ................ 357/67 S X
4,458,410 7/1984 Sugaki et al. ......................... 29/591

OTHER PUBLICATIONS

Kircher, C. J. et al. "Interconnection Method for Integrated Circuits" in IBM-TDB, 13(2), Jul. 1970, p. 436.
Sinha, A. K. "Silicide-to-Silicon Ohmic Contacts Metalized with Tungsten" in J. Electrochem. Soc.: Solid-State Science and Tech., 120(12), pp. 1767–1771, 12-1973.
Murarka, S. P. et al. "Refractory Silicides of Titanium . . . Interconnects" in IEEE Trans. on Electron Devices, vol. ED–27, No. 8., pp. 1409–1417. Aug. 1980.

Primary Examiner—Brian E. Hearn
Assistant Examiner—Alan E. Schiavelli
Attorney, Agent, or Firm—Kenneth C. Hill; Robert O. Groover; James T. Comfort

[57] ABSTRACT

A method of forming a metallic silicide on silicon or polysilicon in which a masking layer such as silicon dioxide is formed on a silicon slice and patterned to expose selected areas of the slice surface. The slice is then sputter etched followed by in situ deposition of a metal layer. The slice is heated to convert the portion of the metal layer in contact with the silicon and/or polysilicon to a metal silicide, then the non-converted metal is removed by a selective etchant. According to another embodiment of the invention a titanium layer is deposited and reacted in an ambient including nitrogen to prevent the out-diffusion of silicon through the TiSi$_2$ and titanium layers.

8 Claims, 7 Drawing Figures

METHOD OF FORMING A TITANIUM DISILICIDE

BACKGROUND OF THE INVENTION

This invention relates generally to integrated circuit fabrication, and more particularly to a method for forming a metallic silicide on monocrystalline or polycrystalline silicon.

Metallic silicides have been used as an interconnection material in integrated circuits to overcome the disadvantages of polycrystalline silicon, the primary disadvantage being that the minimum sheet resistivity of polysilicon is about 10 ohms/square. For example, titanium silicide with a sheet resistance less than about 1 ohm/square has been used to improve the performance of large scale integrated circuits employing MOSFETs. See, e.g., J. G. Posa, "Silicides Nudging Out Polysilicon", *Electronics*, Vol. 54, No. 22, Nov. 3, 1981, pp. 101–102. Metallic silicides thus permit the scaling down of interconnect and gate linewidths which is required to achieve very large scale integration.

One recent development in the use of silicides is a self-aligned process wherein a masking layer is used to expose selected areas on a silicon slice, followed by deposition of a metal layer. The regions overlying the exposed substrate are converted into a metal silicide by annealing, then the non-converted metal is removed by a selective etch. An example of this process is described in U.S. Pat. No. 4,080,719 to Wilting, wherein silicon dioxide is used as a masking layer and platinum silicide is formed on silicon by heating the substrate at 500° C. The non-converted platinum is removed by etching in aqua regia. The self-aligned process eliminates an additional masking step that would normally be required to pattern the interconnects and gate electrodes.

It is desirable that the silicidation process be reproducible, e.g., that the metal silicide formed over the exposed silicon or polysilicon have a predictable, uniform sheet resistance. It is necessary that the exposed silicon be clean and free of oxide in order to provide an intimate contact of metal to silicon. However, even after oxide removal and deglazing, a thin native oxide forms when a silicon slice is exposed to the ambient before metal deposition. This native oxide has been found to be detrimental to the reproducibilty of the silicidation process.

Another problem that occurs in conventional silicidation processes is out-diffusion wherein during the reaction process silicon diffuses through the silicide layer into the metal layer and reacts with the metal to form metallic silicide outside the original pattern. The linewidth of the original pattern is thus destroyed. In the extreme case, adjacent lines a few microns apart would be shorted by bridging silicide formed by the out-diffused silicon. This has been a major obstacle, for example, to the use of the solid state titanium-silicon reaction in forming titanium silicide on patterned slices.

SUMMARY OF THE INVENTION

Accordingly, the present invention provides an improved integrated circuit fabrication process for forming a metallic silicide on silicon and/or polysilicon.

In one embodiment of the invention a masking layer such as silicon dioxide is formed on a silicon slice and patterned to expose selected areas of the slice surface. The slice is then sputter etched to remove native oxide from the exposed silicon or polysilicon, followed by in situ deposition of a metal layer overlying the slice. The slice is then heated to convert the metal overlying the silicon and/or polysilicon to a metallic silicide, then the non-converted metal is removed by a selective etchant. According to another embodiment of the invention wherein a titanium layer is deposited on the slice, the titanium and silicon or polysilicon are reacted in an ambient including nitrogen to prevent the out-diffusion of silicon through the TiSi$_2$ and titanium layers.

BRIEF DESCRIPTIONS OF THE DRAWINGS

Other objects and many of the attendant advantages of the present invention will become apparent, and the invention will be better understood by reference to the following detailed description and appended claims when read in conjunction with the accompanying drawings, wherein:

DETAILED DESCRIPTION OF THE PREFERRED EMBODIMENTS

Figure 1:
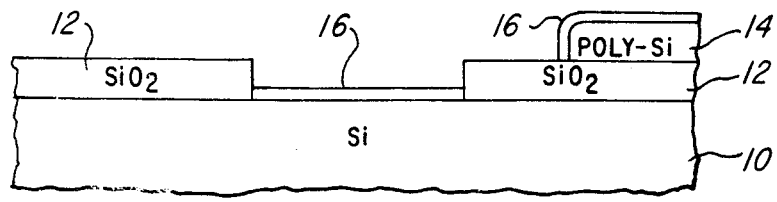
FIGS. 1–5 are cross-sectional views in elevation of a portion of a semiconductor slice showing the slice at various stages of fabrication according to one embodiment of the present invention.

Referring now to the drawings, there is shown in FIGS. 1–5 cross-sectional views of a portion of a semiconductor slice at various stages of fabrication according to one embodiment of the present invention. As shown in FIG. 1, a layer of silicon dioxide 12 is formed on a silicon substrate 10, for example, by thermal oxidation or chemical vapor deposition, and patterned by conventional methods well known in the art to form openings exposing selected surface areas of substrate 10. A polycrystalline silicon, or polysilicon, layer may additionally be formed and patterned to form regions 14 on layer 12 prior to the patterning thereof. The slice is then prepared for metal deposition, for example, by exposure to a solution of H$_2$SO$_4$ and H$_2$O$_2$ followed by deglazing with a 10% solution of HF. A thin layer 16 of native oxide forms on the silicon substrate 10 and polysilicon region 14 when the slice is exposed to the ambient atmosphere after the deglaze and before loading into a vacuum system for metal deposition. As explained hereinabove this native oxide layer 16 has been found to be detrimental to the uniformity of the metal silicide subsequently formed.

Figure 2:
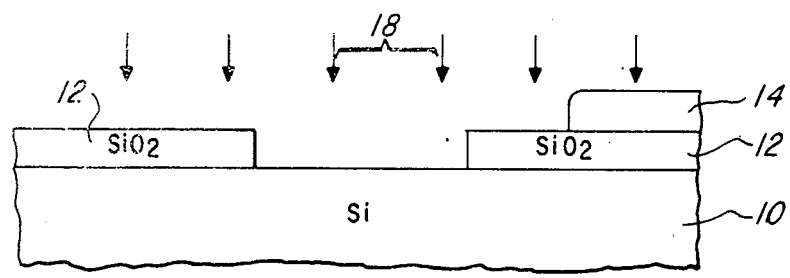
Figure 3:
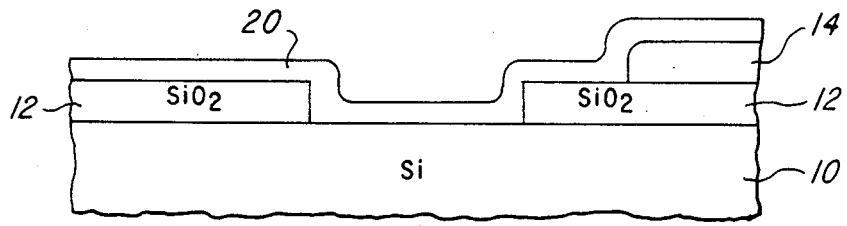
Figure 4:
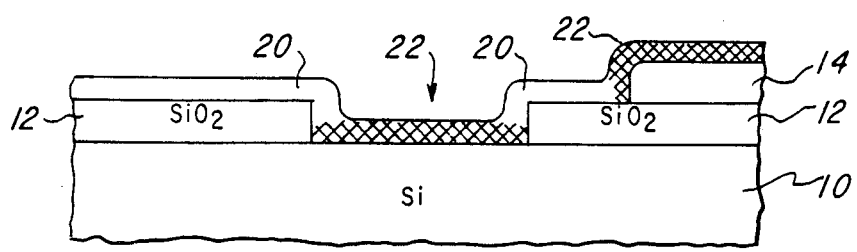
Figure 5:
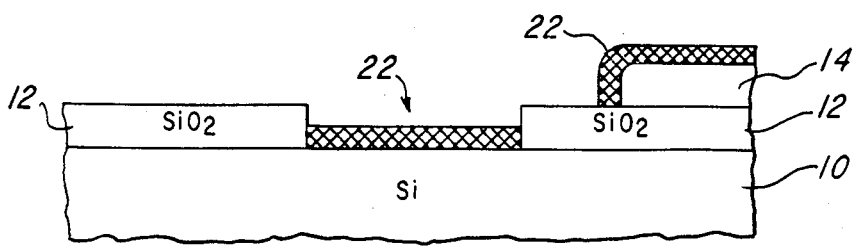

It has been determined that an effective method of preparing the slice is an in situ sputter etching in a vacuum apparatus prior to metal deposition. Referring to FIG. 2, arrows 18 represent the bombardment of the slice by particles in the vacuum system, which effectively removes the native oxide 16 from the substrate 10 and polysilicon region 14. A metal layer 20, as shown in FIG. 3, is then sputter deposited to the desired thickness onto the slice, overlying layers 10, 12 and region 14. The slice is removed from the vacuum system and heated in an inert atmosphere such as nitrogen, argon or a vacuum, to react the metal with the silicon substrate 10 and polysilicon region 14, converting the portions of layer 20 in contact therewith to metallic silicide regions 22 extend partially into substrate 10 and region 14, since the silicon and polysilicon are partially converted during the silicidation process. The unreacted portions of layer 20 are then removed by exposing the slice to an etchant selective against the metal but not the metallic silicide. For example, a suitable etchant in the case of titanium is a wet etch comprising a solution of $H_2SO_4$ and $H_2O_2$. The resulting structure is shown in FIG. 5. The process may be completed by annealing the slice to further lower the resistivity of the metallic silicide 22. It will be apparent that the foregoing process is advantageous in the formation of numerous metallic silicides other than $TiSi_2$, for example silicides of Pt, Pd, Co, Mo, Ta and W.

Figure 6:
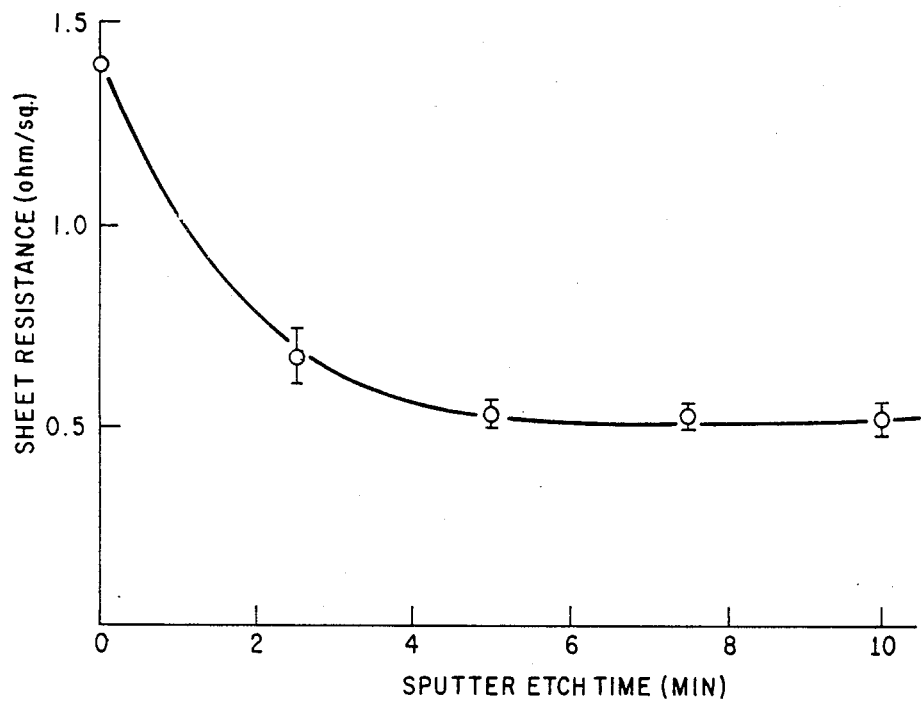
FIG. 6 is a graphical representation of silicide sheet resistance as a function of sputter etch time according to one method of the present invention.

In a specific example of the present process, the sputter etching was performed in a magnetron sputtering system evacuated to a pressure of about 8 millitorr with an argon ambient. The etch time was about 5 minutes at an RF power of approximately 1 kW, resulting in an oxide etch rate of about 20–30 Angstroms/min. The thickness of the native oxide layer 16 is typically only on the order of about 20 Angstroms. However, it has been found that a sputter etch time greater than that required to remove the native oxide results in a substantially lower sheet resistance of the subsequently formed silicide. This may be seen by referring to FIG. 6 which is a graphical representation of the measured sheet resistance of $TiSi_2$ in ohms/square as a function of sputter etch time in minutes. Variations of the etch parameters will result in different oxide etch rates and correspondingly different required etch times.

Figure 7:
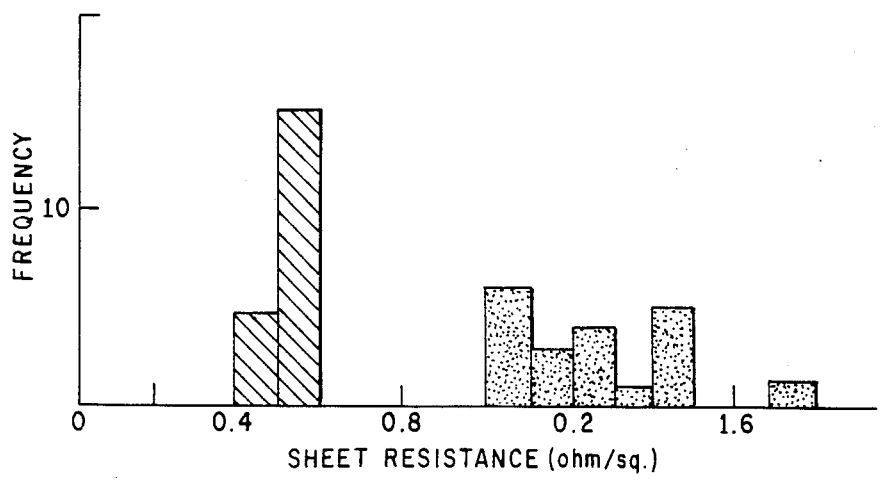
FIG. 7 is a graphical representation of the distribution of sheet resistance of a number of slices fabricated according to the present invention, as compared to slices fabricated according to prior processes.

FIG. 7 which illustrates a further advantage of the present invention, is a bar graph comparing the measured sheet resistance of a number of slices processed according to the present invention (cross-hatched) to a similar number of slices processed according to prior silicidation methods (dappled). The present method forms a metallic silicide having a sheet resistance in the range of about 0.4–0.6 ohms/square, while the sheet resistance according to the prior art method veries between 0.9–1.8 ohms/square. The present method thus provides a more uniform and reproducible metallic silicide.

Following the sputter etching a titanium layer of about 2000 Angstroms was sputter deposited while the slice was still in the vacuum system. The slice was then placed in a furnace and heated at about 625° C. in an argon ambient for about 30 minutes to react the titanium with the silicon and polysilicon to form $TiSi_2$. The resistivity of the $TiSi_2$ was lowered by annealing the slice at about 800° C. for about 15 minutes in an argon ambient.

In titanium-silicon reaction, it is known that silicon is the dominant diffusing species. Thus, silicon tends to diffuse through the $TiSi_2$ outside the desired pattern. According to another embodiment of the present invention this out-diffusion is eliminated by introducing nitrogen into the reaction ambient. The nitrogen readily diffuses through the titanium and substantially reduces the diffusion of silicon atoms into the $TiSi_2$ and titanium layers beyond the interface region. Nitrogen may be introduced directly into the argon ambient, or a forming gas comprising about 10% hydrogen and about 90% nitrogen may be used. Silicon nitride formation is effectively prevented by maintaining the reaction temperature at less than about 700° C.

Other embodiments and modifications of the present invention will readily come to those skilled in the art having the benefit of the foregoing description and drawings. It is therefore to be understood that such modifications and embodiments are intended to fall within the spirit and scope of the appended claims.

What is claimed is:

1. A method of forming titanium disilicide comprising the steps of:
    forming and patterning an insulating layer on a silicon layer to expose selected surface areas thereof;
    forming a titanium layer overlying said insulating layer and said selected surface areas; and
    heating the resulting structure to a temperature less than about 700° C. in an atmosphere comprising nitrogen to form titanium disilicide on said selected silicon surface areas in contact with said titanium layer whereby silicon nitride formation is effectively prevented.

2. The method of claim 1 wherein said insulating layer comprises silicon dioxide.

3. The method of claim 2 wherein said step of forming said titanium layer is immediately preceded by the step of sputter etching said silicon and silicon dioxide layers in an inert atmosphere.

4. The method of claim 2 wherein said step of forming and patterning said silicon dioxide layer is followed by the step of forming and patterning a layer of polycrystalline silicon on said silicon dioxide layer.

5. The method of claim 3 wherein said step of forming and patterning said silicon dioxide layer is followed by the step of forming and patterning a layer of polycrystalline silicon on said silicon dioxide layer.

6. A method of forming titanium disilicide, comprising the steps of:
    forming a patterned polycrystalline silicon layer on an insulating layer;
    forming a titanium layer overall; and
    heating the resulting structure to a temperature less than about 700° C. in an ambient comprising nitrogen to form titanium disilicide in the titanium layer overlying the polycrystalline layer whereby silicon nitride formation is effectively prevented.

7. A method of forming titanium disilicide, comprising the steps of:
    patterning an insulating layer on a silicon substrate to form openings therein;
    forming and patterning a layer of polycrystalline silicon over the insulating layer;
    forming a layer of titanium overall;
    heating the resulting structure to a temperature less than about 700° C. in an atmosphere containing nitrogen to form titanium disilicide over the openings and over the polycrystalline silicon whereby silicon nitride formation is effectively prevented; and
    removing the titanium which has not been converted to disilicide.

8. A method of forming titanium disilicide, comprising the steps of:
    forming a patterned polycrystalline silicon layer on an insulating layer;
    forming a titanium layer overall; and
    heating the resulting structure to a temperature less than about 700° C. in an ambient comprising nitrogen to prevent silicon outdiffusion and to form titanium disilicide in the titanium layer overlying the polycrystalline layer whereby silicon nitride formation is effectively prevented.

* * * * *